(12) United States Patent
Kalavrouziotis et al.

(10) Patent No.: US 12,255,439 B2
(45) Date of Patent: Mar. 18, 2025

(54) LIGHT EMITTING SILICON DEVICE

(71) Applicants: MELLANOX TECHNOLOGIES, LTD., Yokneam (IL); BAR-ILAN UNIVERSITY, Ramat Gan (IL)

(72) Inventors: Dimitrios Kalavrouziotis, Papagou (GR); Paraskevas Bakopoulos, Ilion (GR); Elad Mentovich, Tel Aviv (IL); Anna Sandomirsky, Nesher (IL); Boaz Atias, Maale Adumim (IL); Doron Naveh, Petah-Tikva (IL); Eilam Zigi Ben Smolinsky, Ramat Gan (IL); Adi Levi, Rosh HaAyin (IL); Rana Darweesh, Judieda Maker (IL)

(73) Assignee: MELLANOX TECHNOLOGIES, LTD., Yokneam (IL)

(*) Notice: Subject to any disclaimer, the term of this patent is extended or adjusted under 35 U.S.C. 154(b) by 763 days.

(21) Appl. No.: 17/540,440

(22) Filed: Dec. 2, 2021

(65) Prior Publication Data

US 2023/0170670 A1    Jun. 1, 2023

(30) Foreign Application Priority Data

Nov. 29, 2021   (GR) ................ 20210100826

(51) Int. Cl.
*H01S 5/10*      (2021.01)
*H01S 5/02*      (2006.01)
*H01S 5/026*     (2006.01)
*H01S 5/042*     (2006.01)
*H01S 5/30*      (2006.01)

(52) U.S. Cl.
CPC .......... *H01S 5/1014* (2013.01); *H01S 5/021* (2013.01); *H01S 5/026* (2013.01); *H01S 5/04256* (2019.08); *H01S 5/30* (2013.01)

(58) Field of Classification Search
CPC .... H01S 5/30–36; H01S 5/021; H01S 5/1014; H01S 5/04256–04257; H01S 5/0424; H01S 5/04257
See application file for complete search history.

(56) References Cited

U.S. PATENT DOCUMENTS

| | | | | |
|---|---|---|---|---|
| 2017/0338621 A1* | 11/2017 | Li | .................... | H01L 21/02488 |
| 2018/0241176 A1* | 8/2018 | Abel | ..................... | H01S 5/2031 |
| 2018/0375294 A1* | 12/2018 | Hashimoto | ........... | H01S 5/0203 |
| 2019/0089123 A1* | 3/2019 | Husko | ....................... | H01S 5/30 |

(Continued)

*Primary Examiner* — Sean P Hagan
(74) *Attorney, Agent, or Firm* — Sheridan Ross P.C.

(57) ABSTRACT

A light emitting device, a transmitter, and a silicon photonics chip, among other things, are disclosed. An illustrative light emitting device is disclosed to include a silicon substrate, a waveguide disposed on or integrated in the silicon substrate, where the waveguide includes a wide waveguide section at a first end and a narrow waveguide section at a second end, a first metal pad disposed over the wide waveguide section and at least partially across the first end of the waveguide, and a second metal pad disposed over the wide waveguide section, distanced away from the first metal pad. Electrical current passing between the first metal pad and the second metal pad may cause light to be produced in the wide waveguide section and the light produced in the wide waveguide section is at least partially reflected by the first metal pad and directed to the narrow waveguide section for transmission.

21 Claims, 10 Drawing Sheets

(56) References Cited

U.S. PATENT DOCUMENTS

| | | | |
|---|---|---|---|
| 2019/0250328 A1* | 8/2019 | Yagi | G02B 6/132 |
| 2020/0227894 A1* | 7/2020 | Reboud | H01L 21/0245 |
| 2021/0013701 A1* | 1/2021 | Hashimoto | H01S 5/04256 |
| 2022/0255290 A1* | 8/2022 | Niwa | H01L 31/03046 |

* cited by examiner

LIGHT EMITTING SILICON DEVICE

CROSS REFERENCE TO RELATED APPLICATION

This application claims the benefit of Greece Patent Application No. 20210100826 filed Nov. 29, 2021, the disclosure of which is incorporated herein by reference in its entirety.

FIELD OF THE DISCLOSURE

The present disclosure is generally directed to light emitting devices and systems incorporating the same.

BACKGROUND

Silicon photonics emerged more than a decade ago, bringing the promise of low-cost manufacturing of high bandwidth, key enabling photonics components. The recipe towards this target involved the exploitation of the widely deployed Complementary Metal-Oxide-Semiconductor (CMOS) manufacturing ecosystem, and the well-established CMOS processing know-how.

The world has recently witnessed a gradual industrial shift towards silicon photonics, with more and more large-scale CMOS fabs announcing the development of photonics fabrication lines. The advantages of silicon photonics are expected to be of significant value to component and system vendors in the future generation of devices. However, despite the compelling attributes of the technology, there is a significant building block that is still missing from the silicon photonics portfolio. Owing to the material's indirect bandgap, silicon cannot offer light emission.

This is a major disadvantage, particularly for telecommunication and data vendors, and has forced the industry to investigate alternative ways of implementing laser sections in silicon photonics. Typical examples can be found in the heterogeneous integration or epitaxial growth of III-Vs on silicon wafers, or the flip-chip assembly of gain mediums on properly designed silicon chips, etc. Each of these techniques comes with advantages and disadvantages, nevertheless, almost all of them suffer from a significant drawback—increased manufacturing costs.

BRIEF SUMMARY

In an illustrative embodiment, a light emitting device includes: a silicon substrate; a waveguide disposed on or integrated in the silicon substrate, where the waveguide includes a first end and a second end opposing the first end, where the waveguide includes a wide waveguide section at the first end and a narrow waveguide section at the second end; a first metal pad disposed over the wide waveguide section and at least partially across the first end of the waveguide, where the first metal pad also covers at least a portion of a top end of the wide waveguide section; and a second metal pad disposed over the wide waveguide section, distanced away from the first metal pad, where electrical current passing between the first metal pad and the second metal pad causes light to be produced in the wide waveguide section and wherein the light produced in the wide waveguide section is at least partially reflected by the first metal pad and directed to the narrow waveguide section for transmission.

In an illustrative embodiment, a transmitter includes: a silicon-based light emitting device, including: a silicon waveguide disposed on or integrated in a silicon substrate, where the silicon waveguide includes a first end and a second end opposing the first end, where the silicon waveguide includes a wide waveguide section in proximity with the first end and a narrow waveguide section in proximity with the second end; a first metal pad disposed over the wide waveguide section, where the first metal pad covers at least a portion of a top end of the wide waveguide section and at least a portion of the first end of the silicon waveguide; and a second metal pad disposed over the wide waveguide section and distanced away from the first metal pad, where electrical current passing between the first metal pad and the second metal pad causes light to be produced in the wide waveguide section and where at least some light produced in the wide waveguide section is reflected by the first metal pad and directed to the narrow waveguide section for transmission.

In an illustrative embodiment, a silicon photonics chip includes: a silicon waveguide disposed on or in a silicon substrate, where the silicon waveguide includes a first end and a second end opposing the first end, where the silicon waveguide includes a wide waveguide section in proximity with the first end and a single-mode waveguide section in proximity with the second end; a first electrical contact disposed over the wide waveguide section, where the first electrical contact covers at least a portion of a top end of the wide waveguide section and at least a portion of the first end of the silicon waveguide; and a second electrical contact disposed over the wide waveguide section and distanced away from the first electrical contact, where electrical current passing between the first electrical contact and the second electrical contact causes light to be produced in the wide waveguide section and where at least some light produced in the wide waveguide section is reflected by the first electrical contact and directed to the single-mode waveguide section.

Additional features and advantages are described herein and will be apparent from the following Description and the figures.

BRIEF DESCRIPTION OF THE DRAWINGS

The present disclosure is described in conjunction with the appended figures, which are not necessarily drawn to scale.

DETAILED DESCRIPTION

Figure 1:
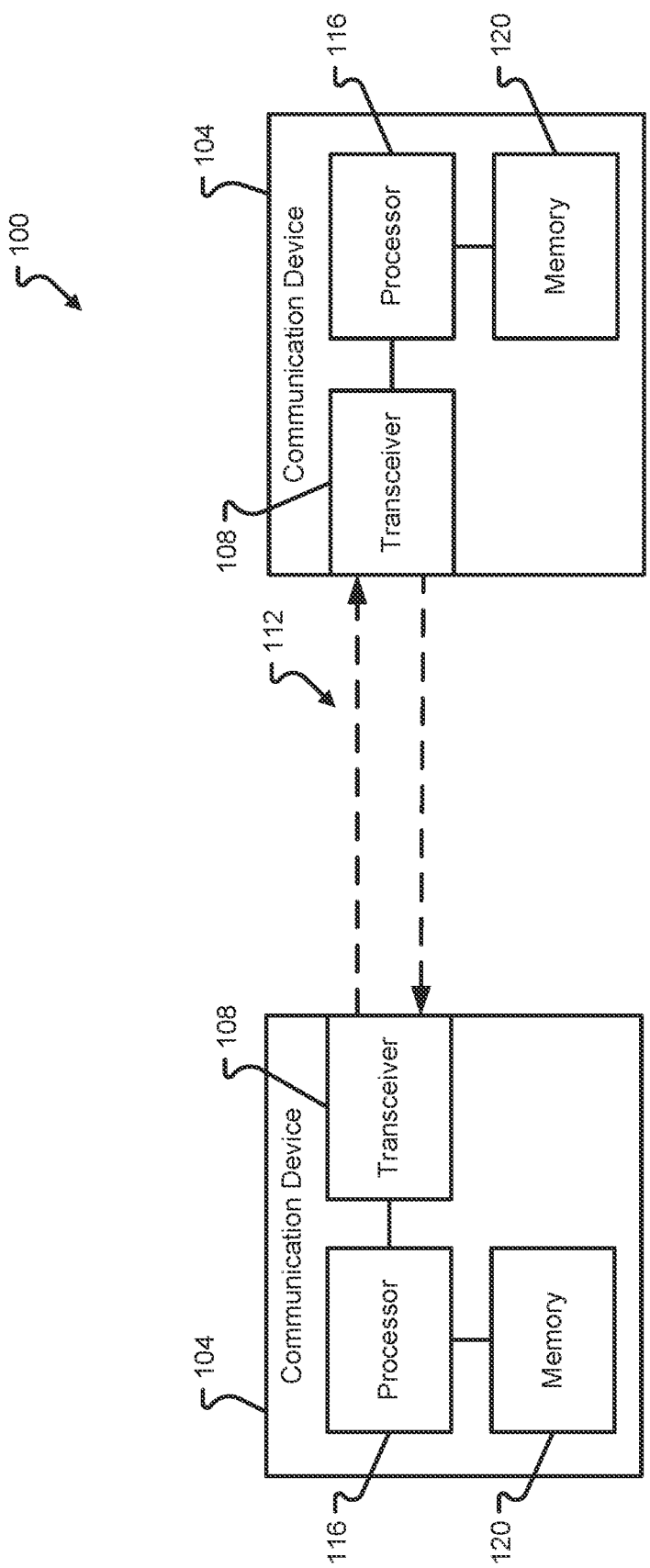
FIG. 1 illustrates a system according to at least one example embodiment.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

It will be appreciated from the following description, and for reasons of computational efficiency, that the components of the system can be arranged at any appropriate location within a distributed network of components without impacting the operation of the system.

Furthermore, it should be appreciated that the various links connecting the elements can be wired, traces, or wireless links, or any appropriate combination thereof, or any other appropriate known or later developed element(s) that is capable of supplying and/or communicating data to and from the connected elements. Transmission media used as links, for example, can be any appropriate carrier for electrical signals, including coaxial cables, copper wire and fiber optics, electrical traces on a PCB, or the like.

As used herein, the phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The terms "determine," "calculate," and "compute," and variations thereof, as used herein, are used interchangeably and include any appropriate type of methodology, process, operation, or technique.

Various aspects of the present disclosure will be described herein with reference to drawings that may be schematic illustrations of idealized configurations.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Embodiments of the present disclosure take advantage of two-dimensional material integration on silicon, to develop a compact light emitting device, in a low-cost, large-volume compatible approach. The disclosed approach substantially circumvents the need for expensive III-V gain mediums and advanced assembly/integration techniques. Instead, embodiments disclosed herein can utilize two-dimensional materials on the surface of the silicon chip. The two-dimensional material is transferred, mechanically or by Laser Direct Transfer (LDT), or chemically grown onto the silicon chip. A proposed light emitting device features a fully reflective mirror and can be readily interfaced to co-integrated circuitry to formulate a laser cavity on the silicon chip.

There are several approaches to integrate light emitting devices on silicon, vast majority of them relying on the combination of silicon with III-V materials. Typical examples are the heterogeneous integration, the epitaxial growth, the flip-chip assembly of gain mediums, and more recently the micro-transfer printing etc. None of those methods involve the integration of two-dimensional materials on silicon, while most of them lead to either high manufacturing costs or reduce yield/lifetime.

An aspect of the present disclosure is to develop a low-cost, compact light emitting device on silicon, through the transfer or growth of two-dimensional material flakes/layers directly on silicon waveguides. Embodiments disclosed herein may employ the two-dimensional material/semiconductor junction as the light-emitting component, while it also features one fully reflective mirror operating as the metallic electrode at the same time. The light emitting device can be interfaced to co-integrated circuitry to form a complete laser cavity integrated on silicon photonics.

The approach described herein may employ two-dimensional materials instead of III-Vs and can be compatible with either transfer (by mechanical transfer or LDT) or growth of the two-dimensional material on the silicon surface. As such, the overall manufacturing cost can be lowered compared to existing methods.

Referring now to FIGS. 1-9, various embodiments and configurations of a light emitter or light emitting device will be described. It should be appreciated that the light emitter or light emitting device may be incorporated in a transmitter or transceiver, which is included in any type of suitable communication device. It should be appreciated that features or elements depicted in one configuration can be incorporated into any other configuration of light emitter without departing from the scope of the present disclosure.

Referring initially to FIG. 1, a communication system 100 is depicted in which two communication devices 104 are configured to exchange electronic communications (e.g., packet-based communications) with one another over a communication channel 112. The communication channel 112 may include or be part of a communication network.

Illustratively, but without limitation, the communication devices 104 may correspond to network devices. As such, the communication devices 104 may correspond to any type of device that becomes part of or is connected with a communication network. Examples of suitable devices that may act or operate like a communication device 104 as described herein include, without limitation, one or more of a Personal Computer (PC), a laptop, a tablet, a smartphone, a server, a collection of servers, a networking card, an edge router, a switch, Network Interface Cards, a Top of Rack (ToR) switch, a server blade, or the like. As will be described in further detail herein, the communication device 104 may include a transceiver 108, a processor 116, and memory 120. The transceiver 108 may include hardware that enables communications over the communication channel 112 whereas the processor 116 and memory 120 may include components that enable the communication device 104 to provide a desired functionality or perform certain functions.

The communication channel 112 may traverse a datacenter or any type of communication network (whether trusted or untrusted). Examples of a communication network that may be used to connect communication devices 104 and support the communication channel 112 include, without limitation, an Internet Protocol (IP) network, an Ethernet network, an InfiniBand (IB) network, a Fibre Channel network, the Internet, a cellular communication network, a wireless communication network, combinations thereof (e.g., Fibre Channel over Ethernet), variants thereof, and/or the like. In one specific, but non-limiting example, the communication network enables data transmission between the communication devices 104 using optical signals. In this case, the communication devices 104 and the communication network may include waveguides (e.g., optical fibers) that carry the optical signals.

The transceiver 108 may include electrical components, optical components, or combinations thereof that facilitate communications over the communication channel 112. The components of the transceiver 108 may be coupled to the processor 116. Data, electrical signals, or the like may be exchanged between the transceiver 108 and processor 116. In some embodiments, the processor 116 may utilize the transceiver 108 to transmit data packets to a remote communication device 104 via the communication channel 112. Similarly, data packets received at a transceiver 108 may be decoded by the transceiver 108 and provided to the processor 116 coupled therewith. In some embodiments, the processor 116 may utilize instructions stored in memory 120 to facilitate operations of the communication device 104.

The processor 116 may be or include one or more of an Integrated Circuit (IC) chip, a microprocessor, a Central Processing Unit (CPU), a Graphics Processing Unit (GPU), a Data Processing Unit (DPU), a Field Programmable Gate Array (FPGA), an Application Specific Integrated Circuit (ASIC), combinations thereof, and the like.

The memory 120 may include any number of memory devices, any type of memory device, any combination of different types of memory devices, etc. As an example, the memory 120 may include Random Access Memory (RAM), Read Only Memory (ROM), flash memory, Electronically-Erasable Programmable ROM (EEPROM), Dynamic RAM (DRAM), buffer memory, combinations thereof, and the like.

Referring now to FIGS. 2A-9, various examples and configurations of a light emitter 200 (or light emitting device) will be described. It should be appreciated that a light emitter 200 may be provided as part of a transceiver 108. As a more specific example, the light emitter 200 may be provided as part of a transmitter that is incorporated in a transceiver 108. The transmitter may utilize the light emitter 200 to generate light signals according to an electrical input provided by the processor 116 for purposes of facilitating communications across the communication channel 112.

Figure 2A:
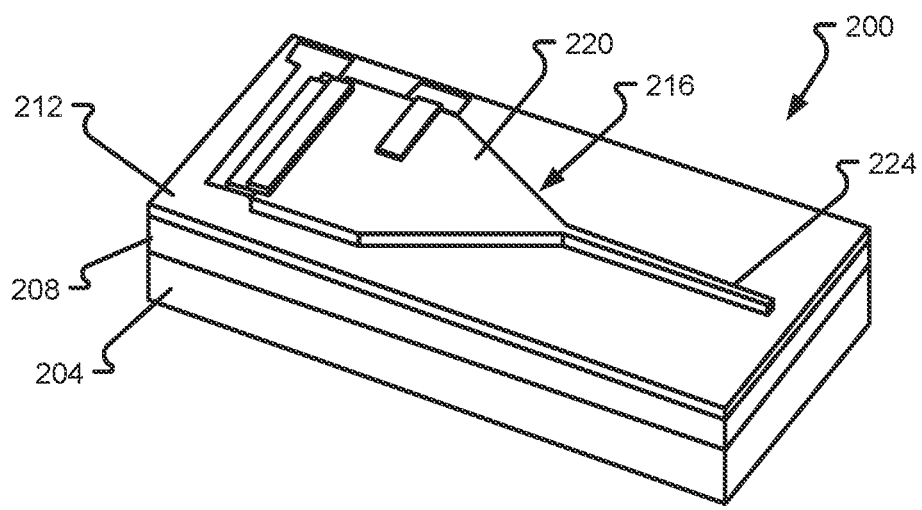
FIG. 2A provides a top isometric view of a light emitter according to at least one example embodiment.
Figure 2B:
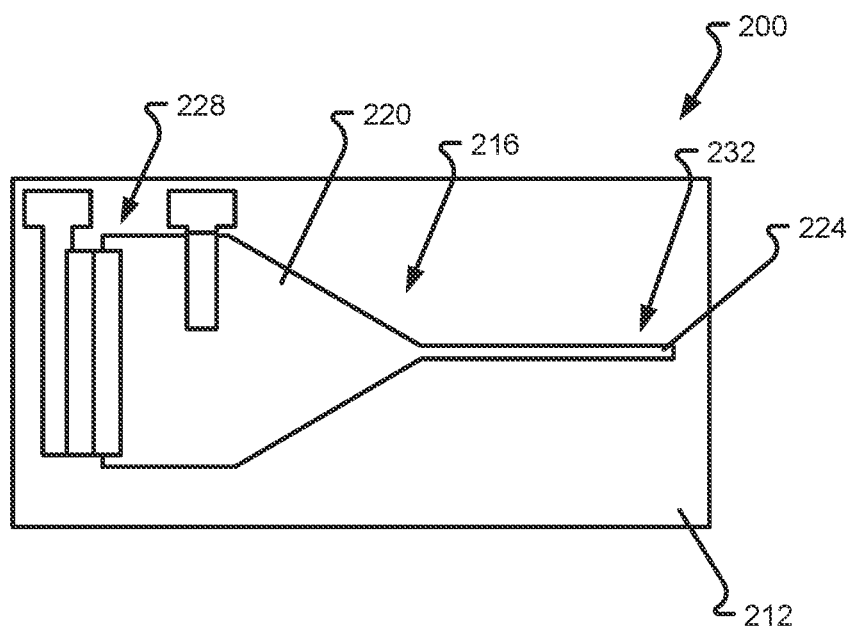
FIG. 2B provides a top view of the light emitter shown in FIG. 2A.

As can be seen in FIGS. 2A and 2B, the light emitter 200 may include a silicon substrate 204, a buried oxide layer 208, and a silicon slab 212. The light emitter 200 may also include a number of other structures positioned on/supported by/disposed on/integrated in the silicon slab 212. Illustratively and without limitation, the components provided on and/or integrated into the silicon slab 212 may include a waveguide 216 having a tapered waveguide section 220 that connects a wide waveguide section 228 with a narrow waveguide section 232. The narrow waveguide section 232 may include, for example, a rib silicon waveguide 224. To reiterate, the waveguide 216 and components thereof may be disposed on or integrated into the silicon substrate 204 and/or the silicon slab 212 provided on top of the silicon substrate 204. In other words, the waveguide 216 may be formed of silicon and have similar material properties as the silicon slab 212 and/or silicon substrate 204.

Figure 3:
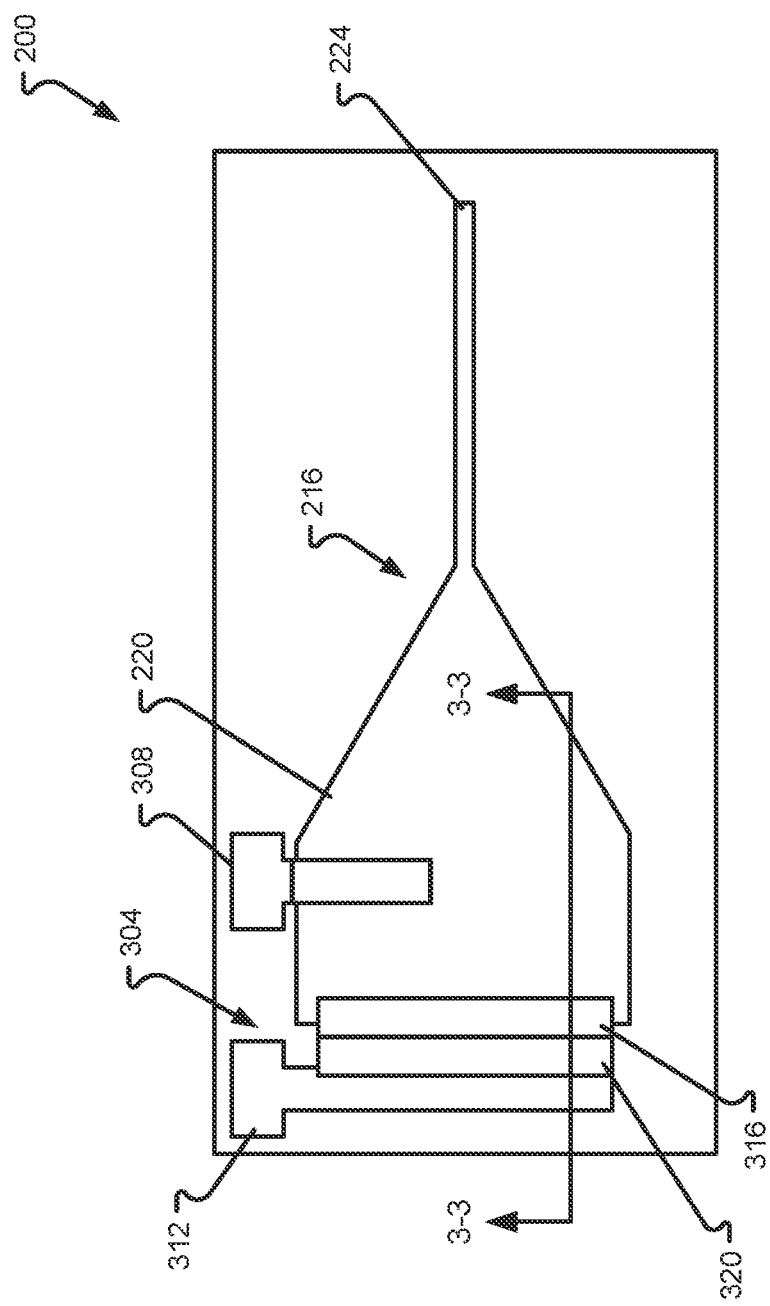
FIG. 3 provides another top view of the light emitter shown in FIG. 2A and illustrates further details of the same.

FIG. 3 illustrates a first metal pad 304 and second metal pad 308 disposed over the waveguide 216. In the depicted example, the first metal pad 304 is disposed over the wide waveguide section 228 and at least partially across a first end of the waveguide 216. The first metal pad 304 may also cover at least a portion of a top end of the wide waveguide section 228. In other words, the first metal pad 304 may cover a portion of the waveguide 216, but may also cover a first side end of the waveguide 216. As will be discussed in further detail herein, the configuration of the first metal pad 304 may enable the structure of the first metal pad 304 to at least partially reflect light from the first end of the waveguide 216 toward an opposing second end of the waveguide 216. To be even more specific, the first metal pad 304 may direct light generated within the waveguide 216 to travel from the wide waveguide section (e.g., from the first side end of the waveguide 216) toward the narrow waveguide section 232 (e.g., toward the opposing second side end of the waveguide 216). Light generated in the wide waveguide section 228 may either travel directly toward the tapered waveguide section 220 and into the narrow waveguide section 232 or may first reflect off the first metal pad 304 before traveling through the tapered waveguide section 220 and into the narrow waveguide section 232.

The narrow waveguide section 232 may correspond to a single-mode waveguide section that supports the propagation of light across a predetermined wavelength range (e.g., using a single transmission mode). In some embodiments, the wide waveguide section 228 is doped (e.g., n-doped or p-doped) and the narrow waveguide section 232 is coupled to additional circuitry to produce a desired spectral tuning. The second end of the waveguide 216 (e.g., the side end of the narrow waveguide section 232) may be positioned in proximity with circuitry that receives light from the narrow waveguide section 232. The circuitry that receives light from the narrow waveguide section 232 may include silicon photonics circuitry. As a more specific but non-limiting example, the silicon photonics circuitry may be coupled with the narrow waveguide section 232 with a spot-size converter. The tapered waveguide section 220 may enable light generated in the wide waveguide section 228 to be focused into the narrow waveguide section 232 in a single mode.

In some embodiments, the tapered waveguide section 220 may provide a silicon taper interfacing the wide waveguide section 228 to a single-mode waveguide section (e.g., the narrow waveguide section 232). A two-dimensional material may be deposited across the wide waveguide section 228 (or grown and shaped on it) and then be covered by one or more metal electrodes (e.g., the first metal pad 304 and/or second metal pad 308). One electrode (e.g., the first metal pad 304) may operate both as an electrical contact and a fully-reflective mirror. The other electrode (e.g., the second metal pad 308) may be deposited over the silicon waveguide 216 so as to supply current to the two-dimensional material through the wide waveguide section 228. To this end, the wide waveguide section 228 would be either p- or n-doped, depending on materials and configurations chosen.

As will be shown in various cross-sectional views of the light emitter 200, the first metal pad 304 may have a number of different possible configurations. Illustratively and without limitation, the first metal pad 304 may include a top level 316 and an intermediate level 320. The intermediate level 320 may connect a contact 312 of the first metal pad 304 with the top level 316. The entire structure of the first metal pad 304 (e.g., the contact 312, top level 316, and intermediate level 320) may be constructed of a singular and unitary conductive material. In some embodiments, however, it may also be possible to construct the portions of the first metal pad 304 with different materials. In some embodiments, the pad contact 312 is in physical contact with the silicon slab 212 whereas the intermediate level 320 and top level 316 are distanced away from the top surface of the silicon slab 212 by a metal pad height, Hpad.

The second metal pad 308 is also disposed over the wide waveguide section 228, but is distanced away from the first metal pad 304. The separation of the first metal pad 304 and second metal pad 308 by the waveguide 216 enables the waveguide 216 to produce light in response to electrical current passing between the first metal pad 304 and the second metal pad 308 because the waveguide 216 may be constructed of a silicon material. In some embodiments, the waveguide 216 may be doped to be an n-type or p-type silicon. An n-type silicon can be used as a cathode while a p-type can be used as an anode. The silicon waveguide 216 provides a mechanism to convert an electrical signal (e.g., based on electrical current passing between the metal pads 304, 308) into an optical signal for transmission by the light emitter 200.

As can be appreciated, in electrical systems between conductive contacts, the contact that donates the electrons is the cathode and the electrons drift/flow toward the anode. Counter-intuitively, since the electron charge is defined as negative, the current direction is from the anode to the cathode.

In semiconductors, electrical current can be composed of weakly bound excited electrons that can move around under external voltage, and of vacancies in the bounded electrons in the crystals. Those vacancies, known as "holes," move when nearby bounded electrons fill them, effectively moving them to the source of the electrons. Holes under voltage move in the opposite direction than electrons. Semiconductors in which the majority of conduction occurs by holes are called p-type, whereas in n-type semiconductors, the conduction is mostly carried out by weakly bounded electrons. The energy level of free electrons in a semiconductor is called the conductance band (Ec) and the energy level of the bounded electrons is called the valence band (Ev). The disclosed light emitter 200 may use silicon as the waveguide 216 and as one of the contacts with a metal pad 304 and/or 308. The silicon of the waveguide 216 can be doped to be n-type or p-type. Embodiments of the present disclosure contemplate light emitter 200 designs with either one semiconductor (homojunction) or two semiconductors (heterojunction).

Various configurations of the light emitter 200 will be described with reference now to FIGS. 4-8. It should be appreciated that these configurations do not represent the limit of light emitter 200 configurations. Rather, a light emitter 200 could be constructed using different features from the different configurations depicted and described herein.

Figure 4:
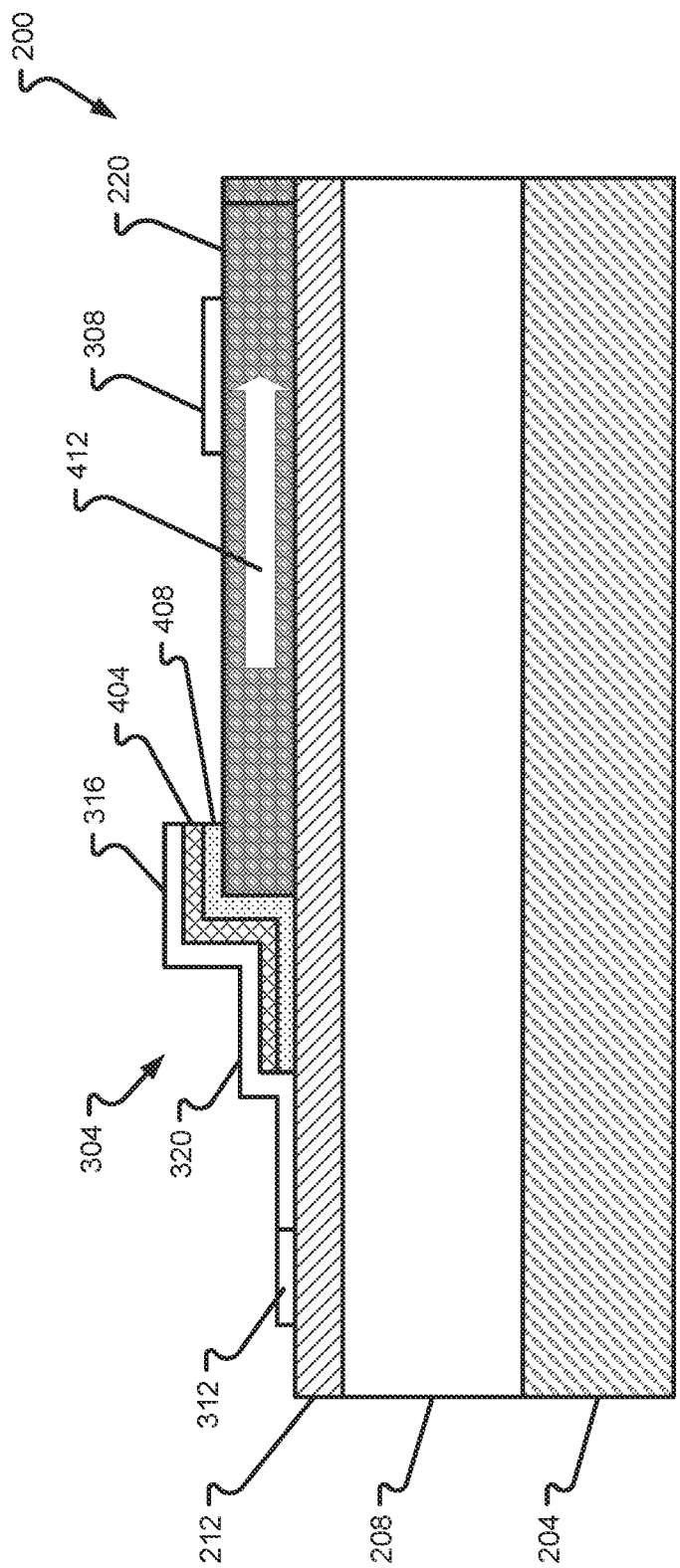
FIG. 4 is a cross-sectional view of an illustrative light emitter shown in FIG. 3 taken across line 3-3.

A first possible configuration of the light emitter 200 is illustrated in FIG. 4. In this particular configuration, a first intermediate layer 404 and second intermediate layer 408 are provided between the first metal pad 304 and the first end of the wide waveguide section 228.

A successful electrical connection of the metal pads 304, 308 with the doped silicon waveguide 216, may involve incorporating additional materials and/or processing steps that are standard part of any suitable silicon photonics process node. Further to that, in the depicted configurations the silicon waveguide 216 is shown to include a rib silicon waveguide 224, allowing for easy opening in the passivation stack (through wet etching for example); the silicon slab 212 can function as an etch stop, allowing the local removal of the passivation stack, before applying the two-dimensional material flakes/layers, which are shown in FIG. 4 as the first intermediate layer 404 and second intermediate layer 408. Any other suitable waveguide type could be also used, but it may be advisable to avoid underetching the silicon waveguide 216.

In the cross-sectional view of FIG. 4, the wide waveguide section 228 corresponds to a p-doped silicon section. The tapered waveguide section 220 and narrow waveguide section 224 are also placed on top of the silicon substrate 212. Material of the wide waveguide section 228 is shown to partially cover some of the silicon slab 212 and some of the wide waveguide section 228. The two-dimensional material used to produce the first metal pad 304 and intermediate layers 404, 408 may conform or follow the shape of the wide waveguide section 228. Configuring the first metal pad 304 in this way forces light to move in a light emitting direction 412. Specifically, because the first metal pad 304 will reflect at least some light generated in the wide waveguide section 228, light can be concentrated in the light emitting direction and focused light can be provided to the narrow waveguide section 232.

It should further be appreciated that the intermediate layers 404, 408 may be constructed of a number of different suitable types of materials. Specifically, a single intermediate layer or multiple intermediate layers may be provided. The intermediate layers 404, 408 may include any number of suitable materials such as thin dielectrics, two-dimensional dielectrics, hole/electron transfer and blocking materials, etc. More specific but non-limiting examples of materials that may be provided in the intermediate layer(s) 404, 408 include an insulator and/or semiconductor that allows the electrical current to pass between the first metal pad 304 and the second metal pad 308. The intermediate layer(s) 404, 408 may also control a bandgap and/or wavelength of the light generated in 2D material at proximity to the silicon waveguide 216.

Additional example materials that can be used for the first metal pad 304 and/or intermediate layer(s) 404, 408 include one or more of Alumina, Hafnium oxide, a silicon oxide, Boron nitride, molybdenum ditelluride, molybdenum disulfide, molybdenum diselenide, hafnium diselenide, tungsten diselenide, tungsten disulfide, and a two-dimensional thin-layered semiconductor.

Figure 5A:
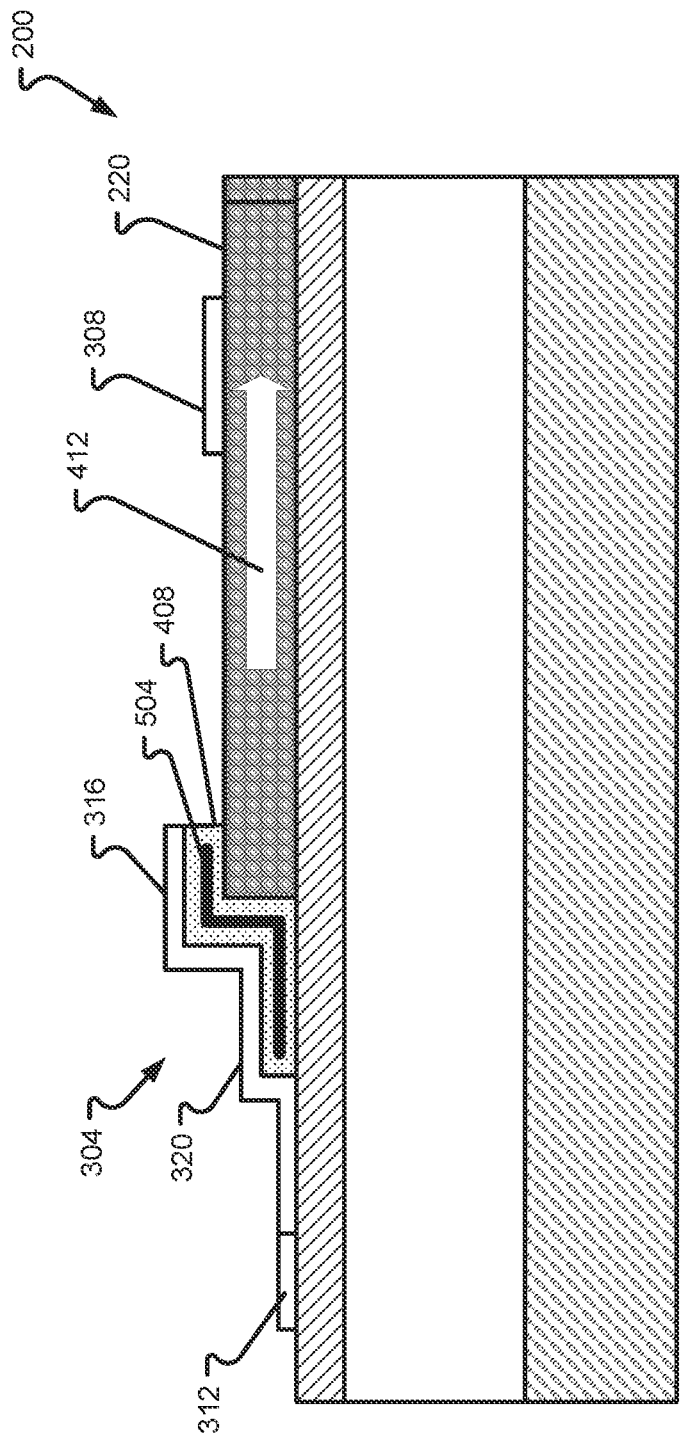
FIG. 5A illustrates another possible configuration of the light emitter shown in FIG. 3 taken across line 3-3.

Another possible configuration shown in FIG. 5A may include a third intermediate layer 504. As an example, the third intermediate layer 504 may include layer of graphene (or a similar semi-metal two-dimensional material) as a transparent electrode, while the first metal pad 304 acts as a reflective mirror and top gate voltage source. The graphene electrode 504 and the top gate would be insulated from one another by an intermediate dielectric layer 408.

Figure 5B:
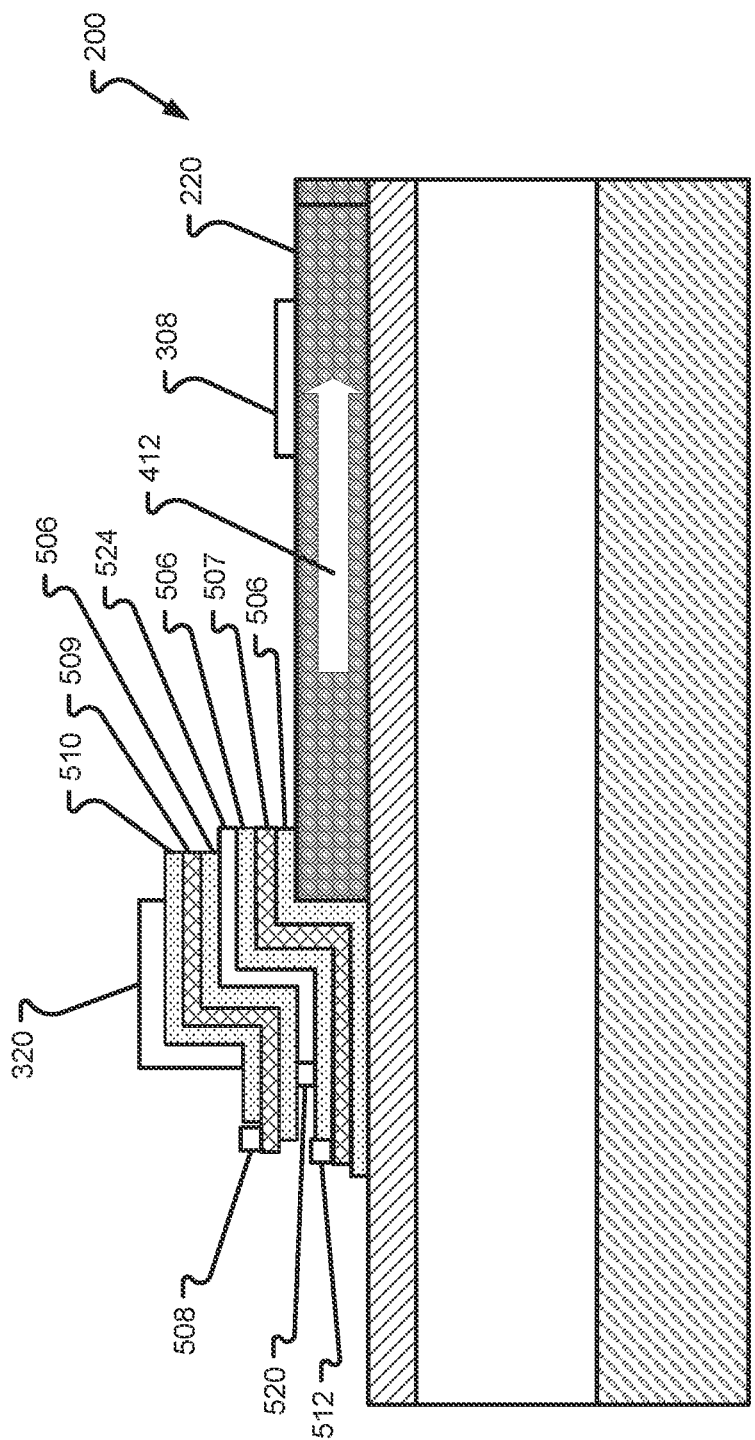
FIG. 5B illustrates a detailed variation of the configuration shown in FIG. 5A.

The third intermediate layer 504 shown in FIG. 5A may actually represent a stack of layers as shown in FIG. 5B. Indeed, the second intermediate layer 408 and third intermediate layer 504 may be constructed of many layers. In the example of FIG. 5B, multiple contacts or metal pads 508, 512, 520 are shown to be adjacent to one or more conductive layers. The intermediate layers include a number of insulating layers 506, a top insulating layer 510, a first graphene layer 507, a second graphene layer 509, and a two-dimensional layer 524. The two-dimensional layer 524 may be or include a semiconductor material. The two-dimensional layer 524 may be sandwiched between sets of insulating layers 506, 510.

In the configuration of FIG. 4, 5A, or 5B, the first metal pad 304 will at least partially function as a mirror to redirect the generated light towards the right side of the depicted design (e.g., in the light emitting direction 412). In other words, the first metal pad 304 will define the light emitting direction 412 of the component, increasing the optical power collected by the wide waveguide section 228. This optical power will be then directed to the tapered waveguide section 220 and will eventually be fed into the narrow waveguide section 232 (e.g., the single-mode waveguide section). Again, part of the wide waveguide section 228 may be doped (e.g., p-doped or n-dopes) so as to generate a low resistance path between the rest of the electrical circuitry (e.g., the second metal pad 308) and the two-dimensional material, effectively creating the second electrical contact of the light emitting diode.

Figure 6:
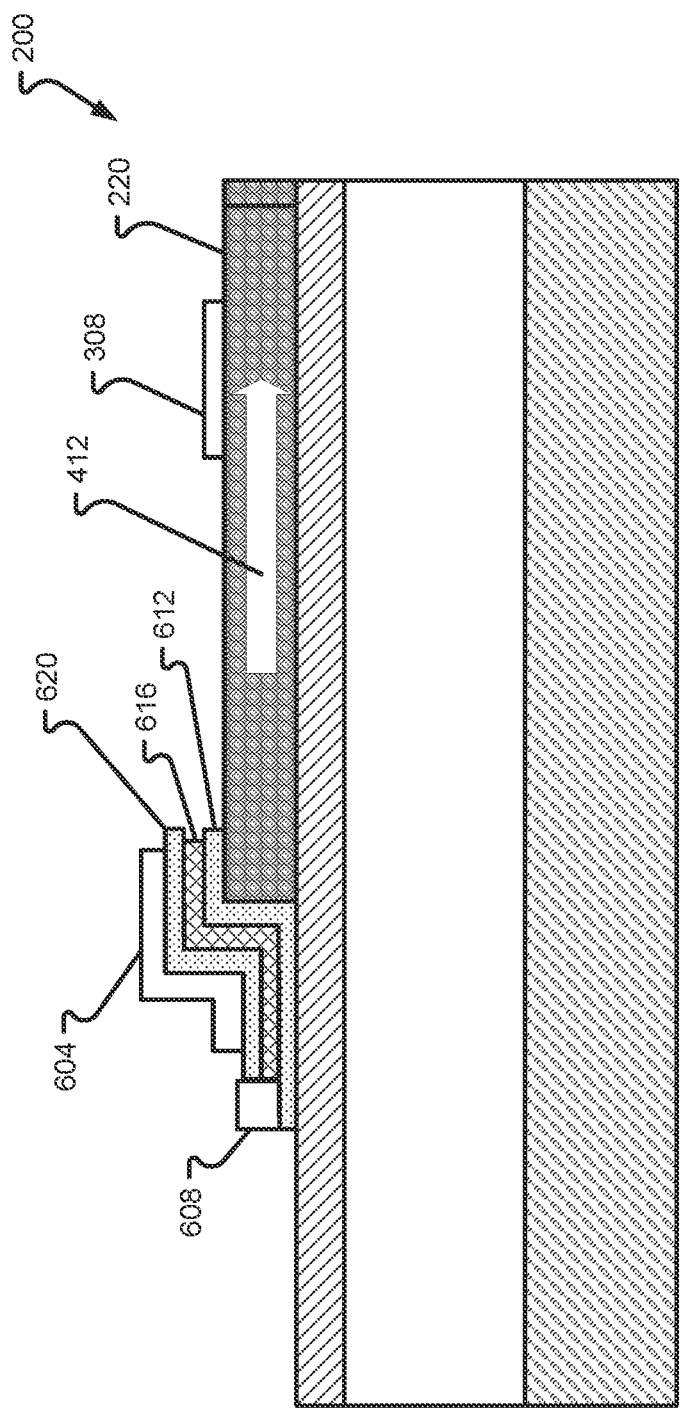
FIG. 6 illustrates yet another possible configuration of the light emitter shown in FIG. 3 taken across line 3-3.

With reference now to FIG. 6, another possible configuration of the light emitter 200 will be described in accordance with at least some embodiments of the present disclosure. The light emitter 200 is shown to include a top contact 604 and lower contact 608 rather than the singular first metal pad 304. The light emitter 200 also include a first tunneling layer 612 and second tunneling layer 620 separated by a two-dimensional semiconductor layer 616. Each of the layers 612, 616, 620 may be considered to form intermediate layers.

The two-dimensional layer 616 is sandwiched between the first tunneling layer 612 and second tunneling layer 620 and does not make direct contact with the silicon waveguide 216. Light is emitted when current is applied either between contact 608 and contact 308 or between contact 608 and contact 604. In the first case layer 620 acts as an insulating layer and voltage between contacts 604 and 608 acts as gate voltage. In the second case, layer 612 acts as an insulating layer and gate voltage may be applied between contacts 608 and 308. The gate voltage may be used to control the efficiency and wavelength of emitted light. The light then travels in the light emitting direction 412 either immediately or after reflecting off the top contact 604.

In some embodiments, if the wide waveguide section 228 is p-doped, then the top contact 604 will act as the cathode whereas if the wide waveguide section 228 is n-doped, then the top contact 604 will act as an anode. The first tunneling layer 612 may act as a tunneling barrier for the current and may further be used to increase the efficiency of light emittance. This first tunneling layer 612 may be between 0.4 and 5 nm thick and may include a thin, non-conductive material such as $SiO_2$, $Al_2O_3$ (alumina), $HfO_2$, MgO, or hBN.

The two-dimensional layer 616 may correspond to the light emitting layer. As such, the two-dimensional layer 616 may include a semiconductor material whose bandgap is that of the required energy. Illustratively, the two-dimensional layer 616 may be between 3 and 5 atomic layers thick.

The top contact 604 can be made of graphene, metal, any other conductive material, or a combination thereof. If the top contact 604 includes metal or some other material that reflects light, then the top contact 604 will provide improved light concentration in the waveguide 216.

The second tunneling layer 620 may also correspond to an insulating layer and may be made or similar materials as the first tunneling layer 612. The second tunneling layer 620 may correspond to an option layer in some embodiments. Illustratively, the second tunneling layer 620 may help to improve charge injection and create a gap between the top contact 604 and the two-dimensional layer 616 to improve light generation within the two-dimensional layer 616. It should be appreciated that the second tunneling layer 620 may be removed or may be replaced by a different layer or type of material to improve the overall efficiency of the light emitter 200. As an example, the second tunneling layer 620 may be replaced with a transfer or blocking layer to help improve light generation efficiencies.

Figure 7:
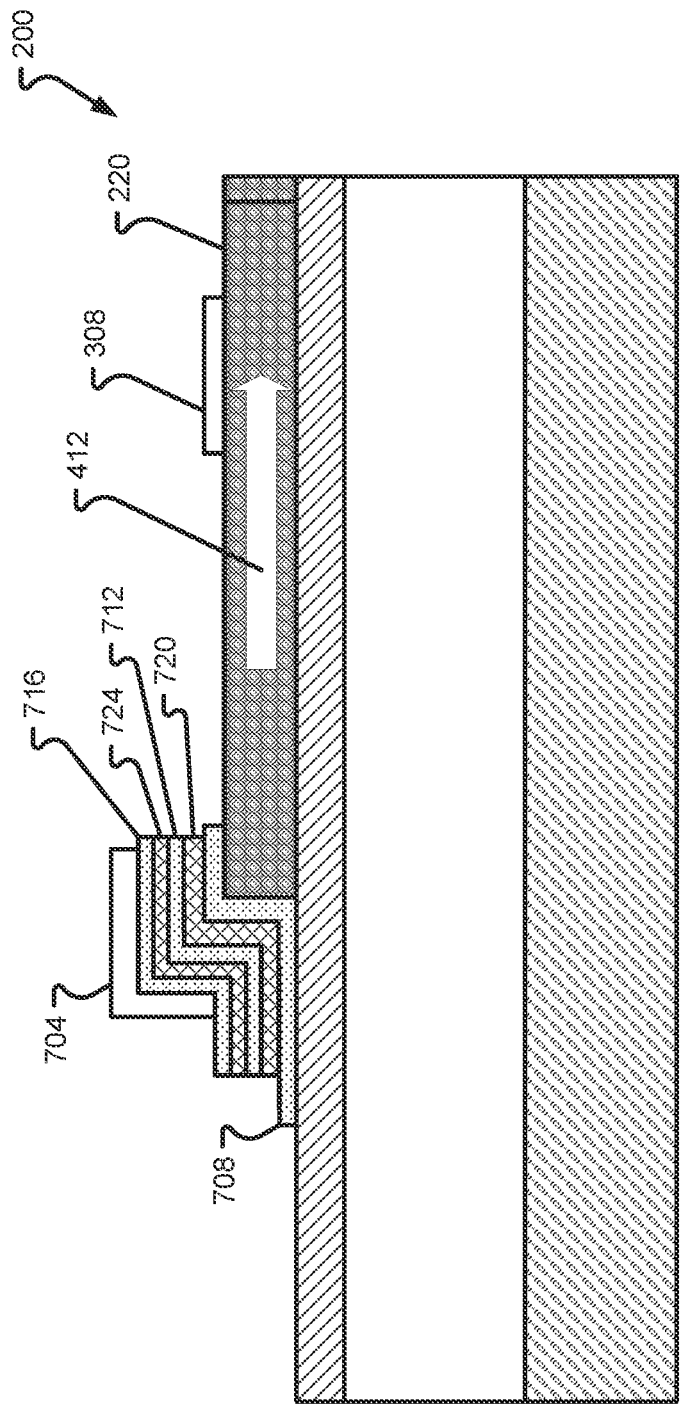
FIG. 7 illustrates still another possible configuration of the light emitter shown in FIG. 3 taken across line 3-3.

Referring now to FIG. 7, another possible configuration of the light emitter 200 will be described in accordance with at least some embodiments of the present disclosure. This configuration exhibits a top contact 704 on top of a number of intermediate layers. The intermediate layers are shown to include a first tunneling layer 708, a middle tunneling layer 712, a third tunneling layer 716, a first two-dimensional layer 720, and a second two-dimensional layer 724. As can be seen in FIG. 7, each two-dimensional layer 720, 724 may be sandwiched between two tunneling layers. In some embodiments, light is emitted at the border between two different semiconductor layers (e.g., at a border between a two-dimensional layer 720, 724 and an adjacent insulating layer 708, 712, 716).

In some embodiments, the first two-dimensional layer 720 and second two-dimensional layer 724 are similar in construction and material type to the other two-dimensional layers depicted and described herein (e.g., two-dimensional layer 616) or any other intermediate layer depicted and described herein. For example, the first two-dimensional layer 720 and the second two-dimensional layer 724 may be designed so that their exciplex provides a desired wavelength (corresponding to a minimum(Ec)–max(Ev)). As an example, the first two-dimensional layer 720 and/or second two-dimensional layer 724 may include one or more of $MoTe_2$, $MoS_2$, or the like and each two-dimensional layer 720, 724 may have a thickness between 3 and 5 atomic layers.

The outer tunneling layers (e.g., the first tunneling layer 708 and third tunneling layer 716) may be used to increase charge injection, to improve light generation, and/or to create a gap between the contacts and the exciton. In some configurations one or both of the tunneling layers 708, 716 can be omitted or replaced with a transfer layer or a blocking layer.

The middle tunneling layer 712 may create separation between the two-dimensional layers 720, 724. The middle tunneling layer 712 may also create two emission lines corresponding to the first two-dimensional layer 720 and the second two-dimensional layer 724. The material used for the middle tunneling layer 712 may be similar or identical to materials used for the other tunneling layers 708, 716, which may be similar or identical to materials used for any other tunneling layer or intermediate layer depicted and described herein.

Figure 8:
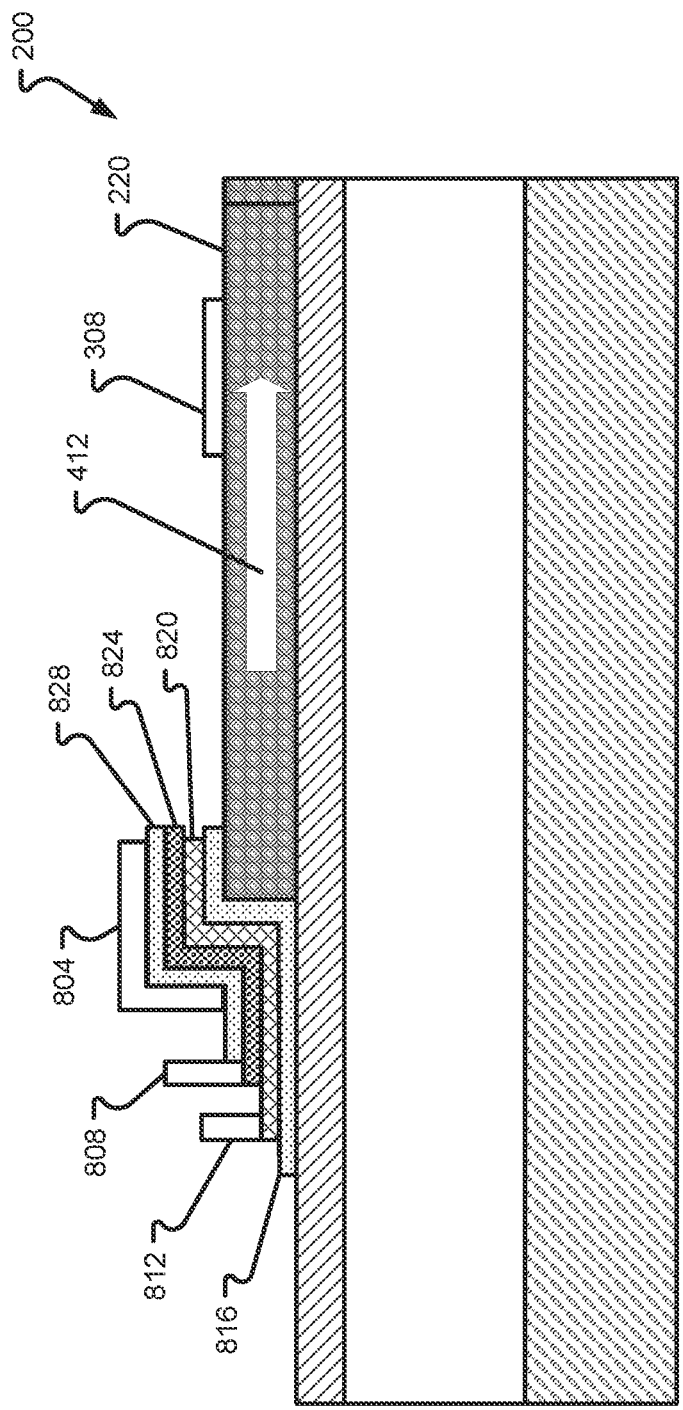
FIG. 8 illustrates another possible configuration of the light emitter shown in FIG. 3 taken across line 3-3.

Referring now to FIG. 8, another possible configuration of the light emitter 200 will be described in accordance with at least some embodiments of the present disclosure. The configuration of FIG. 8 illustrates a light emitter 200 having a top contact 804, a second metal pad 308, a third contact 808, and a fourth contact 812. The light emitter 200 also includes a first tunneling layer 816, a first two-dimensional layer 820, a second two-dimensional layer 824, and a second tunneling layer 828. The two-dimensional layer 820, 824 are shown to be adjacent to one another in this configuration. In some embodiments, light is emitted from the border between the first two-dimensional layer 820 and the second two-dimensional layer 824. It may also be possible to change the wavelength of the light generated therein by applying additional gate voltage across the top contact 804 and third contact 808.

In some embodiments, the materials used for the first two-dimensional layer 820 and the second two-dimensional layer 824 are selected so their exciplex provides a desired wavelength corresponding to (minimum(Ec)−max(Ev)). As an example, the first two-dimensional layer 820 and/or second two-dimensional layer 824 may include MoTe2 and/or MoS2 and may have a thickness between 3 and 5 atomic layers. Light may be emitted due to current flowing between either the third contact 808 and fourth contact 812 or between the third contact 808 and the second metal pad 308.

When current flows between the third contact 808 and the fourth contact 812, the first tunneling layer 816 and second tunneling layer 828 are thick enough to be electrically insulating (e.g., between 10 nm and 30 nm). In this scenario, voltage applied between the second metal pad 308 and the top contact 804 (or between the second metal pad 308 and the fourth contact 812) is used to alter the wavelength and efficiency of light emittance.

When current flows between the third contact 808 and the second metal pad 308, then the second tunneling layer 828 may be thick enough to be electrically insulating (e.g., between 10 nm and 30 nm). The first tunneling layer 816 may be thin enough to be a tunneling barrier and can be omitted or replaced with a transfer or blocking layer. In this scenario, voltage applied between the top contact 804 and third contact 808 is used to adjust the wavelength and efficiency of light emittance.

It should be noted that multilayer transition metal dichalcogenide monolayers (TMDCs) (e.g., MoS2 and MoTe2) have an indirect bandgap that can be modified back to direct gap at the K point of the Brillouin zone (BZ) if an external field is applied, further causing a shrink in the bandgap due to Stark Effect.

Other materials such as GeSe (p-type) and InSe (n-type) have a direct bandgap at the gamma point of BZ irrespective of an applied electric field and the thickness. They form type II heterostructure (e.g., CMB of n-type InSe and VBM of p-type GeSe) at ~0.8 eV that is tunable with an external electric field.

Figure 9:
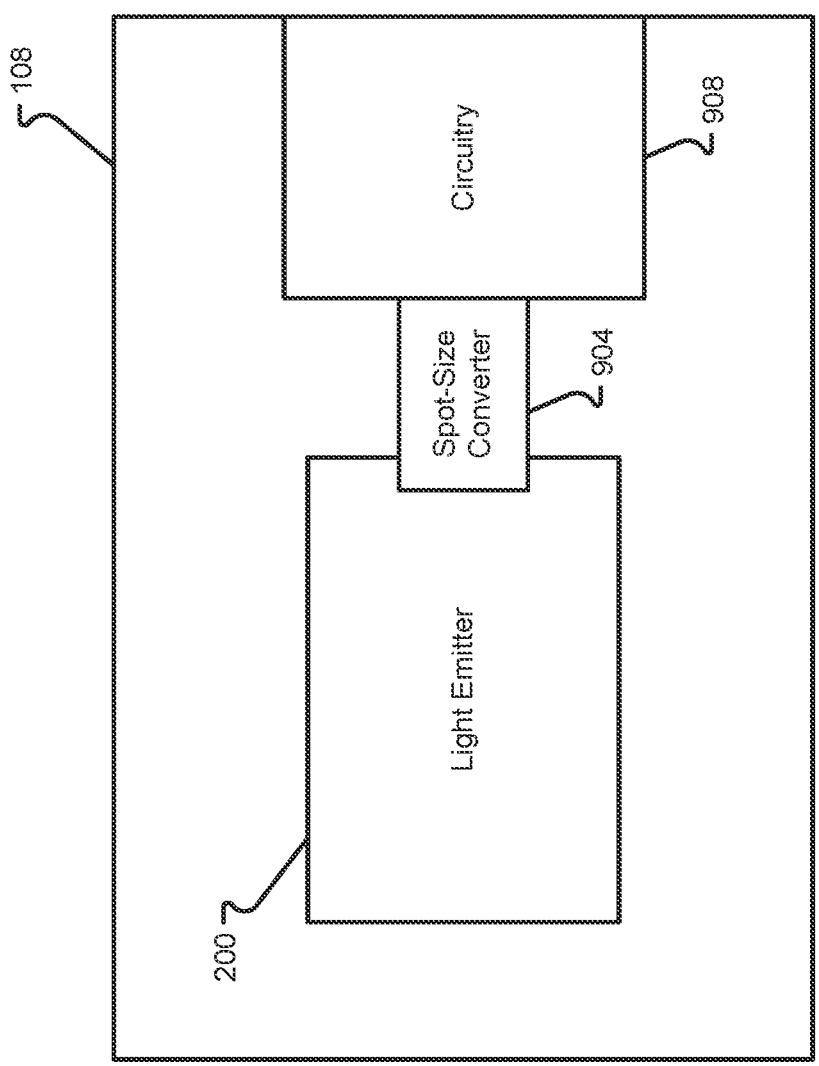
FIG. 9 is a block diagram illustrating additional details of a transceiver according to at least one example embodiment.

With reference now to FIG. 9, additional details of a transceiver 108 including a light emitter 200 will be described in accordance with at least some embodiments of the present disclosure. The transceiver 108 includes the light emitter 200, which is coupled to a spot-size converter 904. The spot-size converter 904 couples the light emitter 200 to circuitry of the transceiver 108. In some embodiments, the second end of the waveguide 216 (e.g., the side end of the narrow waveguide section 232) physically abuts the spot-size converter 904. The circuitry 908 positioned in proximity with the spot-size converter 904 may receive light from the spot-size converter 904, process the light, and produce a laser output for transmission across the communication channel 112. In some embodiments, the circuitry 908 includes silicon photonics circuitry.

More specifically, but without limitation, the light emitter 200 can be interfaced with simple or complex integrated photonics circuitry to implement a laser. There are a number of different approaches that may be employed. For instance, the light emitter 200 can be coupled to passive photonics circuitry 908 targeting to implement a hybrid silicon laser. The passive silicon circuitry could utilize one or more micro ring resonators (MRRs), put together in simple or advanced topologies. Those topologies may utilize a high-Q resonator design, or even the Vernier effect, for achieving high side-mode suppression and good lasing quality. In some cases, the MRRs operate also as the 100% mirrors (of one or both sides) required by the laser cavity.

In some embodiments, the transceiver 108 utilizes a Reflective Semiconductor Optical Amplifier (RSOA) for achieving a unidirectional light generation, that is then coupled to the silicon photonics circuitry 908 through a SiN spot-size converter 904. The silicon photonics side includes all the components for implementing the laser cavity as described above, whereas a directional coupler is used in order to couple some light out of the cavity and towards a grating coupler. Nevertheless, the RSOA can be quite expensive and cumbersome in terms of hybrid integration and assembly. Thus, embodiments of the present disclosure contemplate that the RSOA can be replaced by a simple and straightforward two-dimensional material-based light emitting diode. As such, both the light emitting part and the laser cavity can be implemented on the same integrated chip in a simple cost-effective way.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

It should be appreciated that inventive concepts cover any embodiment in combination with any one or more other embodiment, any one or more of the features disclosed herein, any one or more of the features as substantially disclosed herein, any one or more of the features as substantially disclosed herein in combination with any one or more other features as substantially disclosed herein, any one of the aspects/features/embodiments in combination with any one or more other aspects/features/embodiments, use of any one or more of the embodiments or features as disclosed herein. It is to be appreciated that any feature described herein can be claimed in combination with any other feature(s) as described herein, regardless of whether the features come from the same described embodiment.

What is claimed is:

1. A light emitting device, comprising:
   a silicon substrate;
   a waveguide disposed on or integrated in the silicon substrate, wherein the waveguide comprises a first end and a second end opposing the first end, wherein the waveguide comprises a wide waveguide section at the first end and a narrow waveguide section at the second end;
   a first metal pad disposed over the wide waveguide section and at least partially across the first end of the waveguide, wherein the first metal pad also covers at least a portion of a top end of the wide waveguide section; and
   a second metal pad disposed over the wide waveguide section, distanced away from the first metal pad, wherein electrical current passing between the first metal pad and the second metal pad causes light to be produced in the wide waveguide section and wherein the light produced in the wide waveguide section is at least partially reflected by the first metal pad and directed to the narrow waveguide section for transmission.

2. The light emitting device of claim 1, wherein the narrow waveguide section comprises a single-mode waveguide section and wherein the light emitting device further comprises:
circuitry positioned in proximity with the second end of the waveguide, wherein the circuitry receives the light from the single-mode waveguide section and forms a cavity between one end of the circuitry and the first metal pad, thereby producing a laser output.

3. The light emitting device of claim 2, wherein the waveguide comprises silicon and wherein the circuitry comprises silicon photonics circuitry.

4. The light emitting device of claim 3, wherein the single-mode waveguide section is coupled with the silicon photonics circuitry through a spot-size converter.

5. The light emitting device of claim 1, wherein the waveguide comprises a tapered waveguide section between the wide waveguide section and the narrow waveguide section.

6. The light emitting device of claim 1, further comprising:
an intermediate layer positioned between the waveguide and the first metal pad, wherein the intermediate layer is also disposed at least partially across the first end of the waveguide.

7. The light emitting device of claim 6, wherein the intermediate layer comprises a two-dimensional layer.

8. The light emitting device of claim 7, wherein the two-dimensional layer comprises an insulator and/or semiconductor that allows the electrical current to pass between the first metal pad and the second metal pad and wherein the two-dimensional layer also controls a bandgap and/or wavelength of the light.

9. The light emitting device of claim 7, wherein the two-dimensional layer comprises at least one of Alumina, Hafnium oxide, a silicon oxide, and Boron nitride.

10. The light emitting device of claim 7, wherein the two-dimensional layer comprises a combination of one or more semiconductive light-emitting layers and one or more insulating layers, wherein the one or more semiconductive light-emitting layers comprises one or more of molybdenum ditelluride, molybdenum disulfide, molybdenum diselenide, hafnium diselenide, tungsten diselenide, tungsten disulfide, and a two-dimensional thin-layered semiconductor, and wherein the one or more insulating layers comprise at least one of Alumina, Hafnium oxide, a silicon oxide, and Boron nitride.

11. The light emitting device of claim 10, further comprising:
a silicon slab positioned between the silicon substrate and the waveguide; and
a buried oxide layer positioned between the silicon slab and the silicon substrate.

12. The light emitting device of claim 7, wherein the two-dimensional layer comprises a stack of at least two layers forming a heterojunction.

13. A transmitter, comprising:
a silicon-based light emitting device, comprising:
a silicon waveguide disposed on or integrated in a silicon substrate, wherein the silicon waveguide comprises a first end and a second end opposing the first end, wherein the silicon waveguide comprises a wide waveguide section in proximity with the first end and a narrow waveguide section in proximity with the second end;
a first metal pad disposed over the wide waveguide section, wherein the first metal pad covers at least a portion of a top end of the wide waveguide section and at least a portion of the first end of the silicon waveguide; and
a second metal pad disposed over the wide waveguide section and distanced away from the first metal pad, wherein electrical current passing between the first metal pad and the second metal pad causes light to be produced in the wide waveguide section and wherein at least some light produced in the wide waveguide section is reflected by the first metal pad and directed to the narrow waveguide section for transmission.

14. The transmitter of claim 13, further comprising:
circuitry positioned in proximity with the second end of the waveguide, wherein the circuitry receives the light from the narrow waveguide section and produces a laser output based on the light received from the narrow waveguide section.

15. The transmitter of claim 14, wherein the circuitry comprises silicon photonics circuitry.

16. The transmitter of claim 13, wherein the silicon waveguide comprises a tapered waveguide section between the wide waveguide section and the narrow waveguide section.

17. The transmitter of claim 16, wherein the narrow waveguide section comprises a rib silicon waveguide.

18. The transmitter of claim 17, further comprising:
at least one intermediate layer positioned between the silicon waveguide and the first metal pad.

19. The transmitter of claim 18, wherein the at least one intermediate layer comprises a first two-dimensional layer and a second two-dimensional layer.

20. A silicon photonics chip, comprising:
a silicon waveguide disposed on or in a silicon substrate, wherein the silicon waveguide comprises a first end and a second end opposing the first end, wherein the silicon waveguide comprises a wide waveguide section in proximity with the first end and a single-mode waveguide section in proximity with the second end;
a first electrical contact disposed over the wide waveguide section, wherein the first electrical contact covers at least a portion of a top end of the wide waveguide section and at least a portion of the first end of the silicon waveguide; and
a second electrical contact disposed over the wide waveguide section and distanced away from the first electrical contact, wherein electrical current passing between the first electrical contact and the second electrical contact causes light to be produced in the wide waveguide section and wherein at least some light produced in the wide waveguide section is reflected by the first electrical contact and directed to the single-mode waveguide section.

21. The silicon photonics chip of claim 20, wherein the wide waveguide section is doped and wherein the single-mode waveguide section is coupled to external circuitry to produce a desired spectral tuning.

* * * * *